United States Patent [19]
Lundergan et al.

[11] 4,428,633
[45] Jan. 31, 1984

[54] DUAL-IN-LINE SOCKET ASSEMBLY

[75] Inventors: Robert G. Lundergan, Camp Hill; Richard L. Marks, Mechanicsburg, both of Pa.

[73] Assignee: AMP Incorporated, Harrisburg, Pa.

[21] Appl. No.: 353,298

[22] Filed: Mar. 1, 1982

[51] Int. Cl.³ .............................................. H05K 1/18
[52] U.S. Cl. ................................................ 339/17 CF
[58] Field of Search ..................... 339/17 CF, 147, 98, 339/97 R, 97 P, 99 R, 102

[56] References Cited

U.S. PATENT DOCUMENTS

| | | | |
|---|---|---|---|
| 3,409,857 | 11/1968 | Oneill et al. | 339/17 CF |
| 3,697,818 | 10/1972 | Boursin | 317/101 CW |
| 3,754,203 | 8/1973 | Pauza et al. | 339/17 CF |
| 3,880,493 | 4/1975 | Lockhart, Jr. | 339/147 R |
| 3,912,984 | 10/1975 | Lockhart, Jr. et al. | 339/17 CF |
| 4,045,105 | 8/1977 | Lee et al. | 339/17 CF |
| 4,072,380 | 2/1978 | Freehauf | 339/17 CF |
| 4,089,041 | 5/1978 | Lockard | 361/403 |
| 4,097,106 | 6/1978 | Over et al. | 339/102 R |
| 4,209,218 | 6/1980 | Kosten et al. | 339/102 |
| 4,326,765 | 4/1982 | Brancaleone | 339/17 CF |

Primary Examiner—Joseph H. McGlynn
Assistant Examiner—David L. Pirlot
Attorney, Agent, or Firm—Robert W. J. Usher

[57] ABSTRACT

A dual-in-line socket assembly in which rows of electrical contacts are mounted in cavities extending along the insulating housing, each terminal having a receptacle portion opening to a first, plug receiving, face of the housing and tab portions projecting from a second, opposite housing face. First and second one-piece terminals each comprising a slotted component lead gripping portion and a tab portion are anchored in the housing with the tab portions extending closely adjacent tab portions of respective predetermined contacts to provide composite plugs whereby each terminal tab portions and contact tab portions can be plugged into a common aperture in a printed circuit board. A component may be located in a recess extending between the rows completely within the profile of the housing.

7 Claims, 6 Drawing Figures

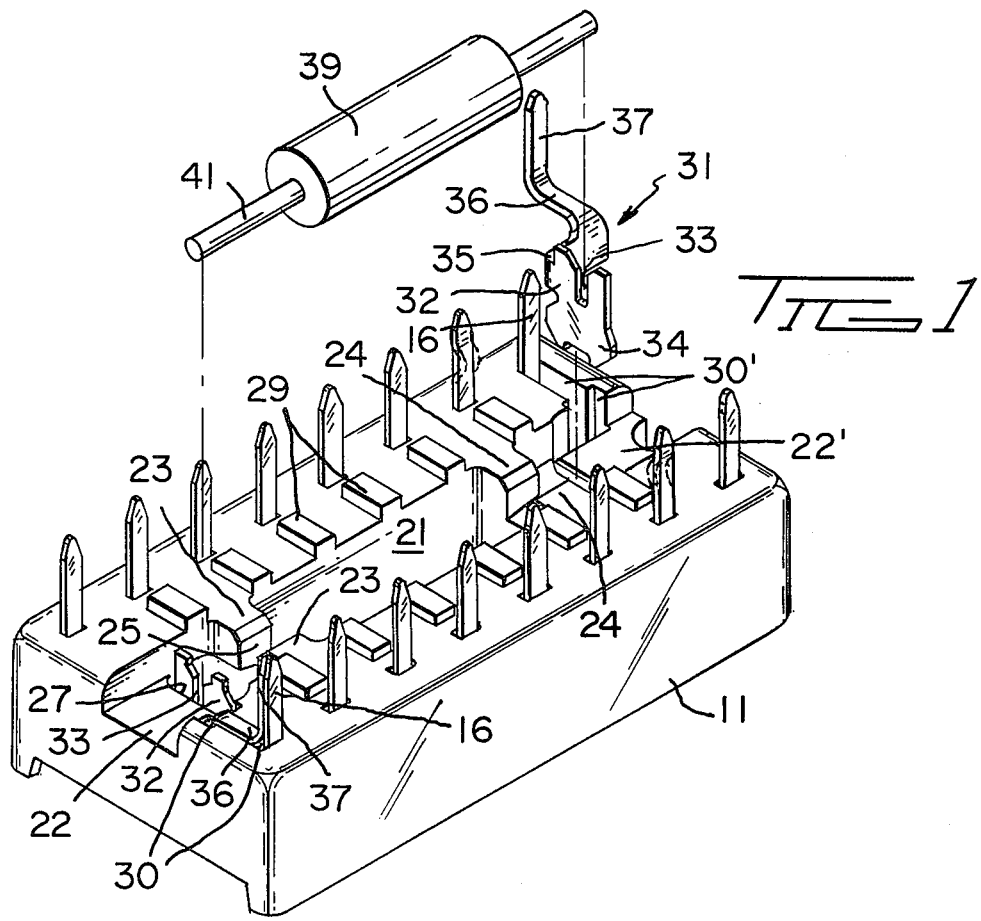
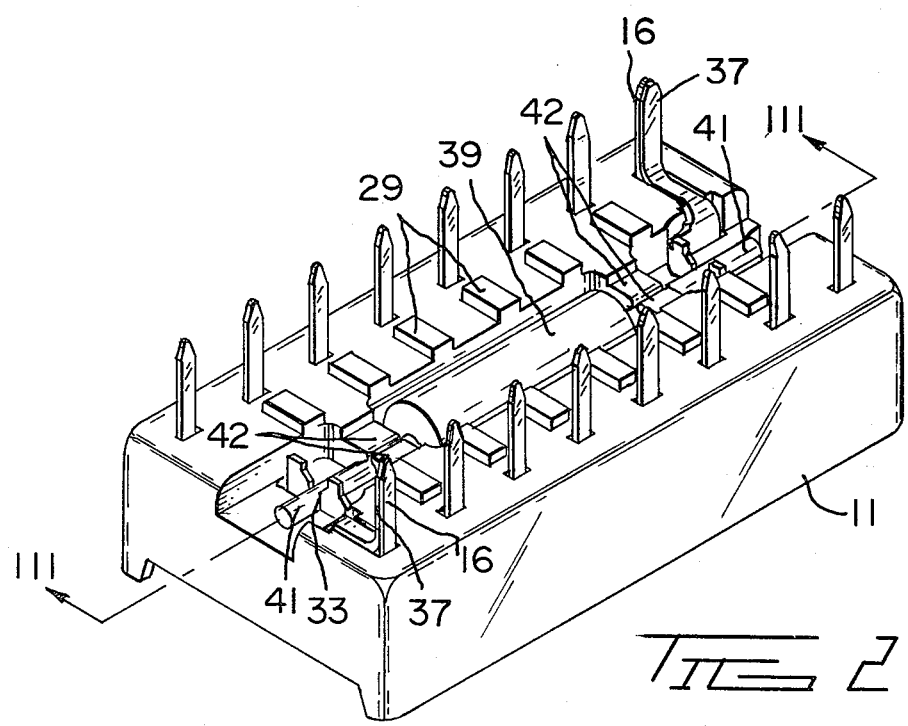

DUAL-IN-LINE SOCKET ASSEMBLY

The invention relates to a dual-in-line socket assembly for mounting a dual-in-line integrated circuit package on a printed circuit board.

Dual-in-line socket assemblies are known and each may comprise a housing moulded in one piece from insulating material with rows of aligned contact-receiving cavities and electrical contacts received in respective cavities, the contacts having receptacle portions opening to a first, pacakage receiving, face of the housing and tab portions projecting from a second, opposite face of the housing.

It is often required to interconnect predetermined contacts with a passive or active circuit element (such as a decoupling capacitor) to provide desired operating characteristics of the integrated circuit when plugged into the socket assembly. In the past, this often required additional wiring operations to be carried out subsequent to mounting the socket assembly in the printing circuit board which operations may be very time consuming and difficult in view of the small involved requiring careful manipulation of the components, such operations not being performed automatically. In addition, additional wiring externally of the socket assembly, would occupy additional space on the printed circuit board.

In one prior proposal described in U.S. Pat. No. 4,072,380, a capacitor is mounted in a dual-in-line socket assembly by inserting the capacitor leads into aligned contact receptacle portions of the socket assembly. However, such construction is not suitable nor intended for subsequently coupling the capacitor to leads of a dual-in-line package during insertion with the dual-in-line socket assembly, the receptacle portions being blocked by the capacitor leads.

An object of the invention is to avoid the above mentioned disadvantages and to provide a dual-in-line socket assembly which permits connection of a component between preselected contacts prior to assembly of the socket assembly on a printed circuit board.

It is a further object to provide a dual-in-line socket assembly which can be manufactured and assembled along relatively simple mass production techniques.

According to the invention, a dual-in-line socket as described above comprises first and second terminals each stamped and formed in one piece from sheet metal and comprising a component lead connecting portion and a tab portion, the terminals being anchored in the housing in spaced apart relation with the tab portions of the terminals extending closely adjacent tab portions of respective predetermined contacts to provide composite plugs whereby each terminal tab portion and adjacent contact tab portion can be plugged into a common aperture in a printed circuit board.

The provision of the terminals in the socket housing assembly both enable the component to be preassembled therein, avoiding a need for subsequent wiring operations on the printed circuit board and permits a space saving on the printed circuit board. In addition, a dual-in-line package may subsequently be mated with the socket assembly with the package tabs inserted in sockets of the preselected contacts without interference.

Preferably, the lead connecting portions comprise plate portions provided with lead receiving slots opening towards a common face of the housing.

This construction enables insertion of the component in the socket assembly using simple lead inserting tooling.

More specifically, the housing is formed with a recess extending between the rows of cavities and sized to receive the component body located completely within the profile of the housing, the lead connecting portions of the terminals being located adjacent respective opposite ends of the recess. Interference with the board mounting and package receiving capabilities is thereby completely avoided.

The housing may be provided with pairs of adjacent lands between respective ends of the recess and the lead gripping portions of the terminals, the lands of each pair defining between them a lead receiving slot and being deformable over mouths of the slots to retain component leads therein.

Desirably, each plate portion is provided at an end remote from the slot opening with an enlargement received in a housing slot in a force fit thereby to anchor each terminal in the housing. This construction further facilitates mass production of the assemblies using simple terminal inserting apparatus.

Specifically, each terminal plate portion is integrally joined to a tab portion by a body having a first portion extending from an edge of the plate perpendicularly to the plate portion being bent along a first fold line parallel with the slot and a second portion extending perpendicularly between the first portion and a root end of the terminal tab, being bent along fold lines perpendicularly to the slot.

A specific example of the invention will now be described with reference to the accompanying drawings in which:

FIG. 1 is a partly exploded isometric view of the dual-in-line socket assembly;

FIG. 2 is a similar view with the parts assembled with a capacitor;

Figure 3:
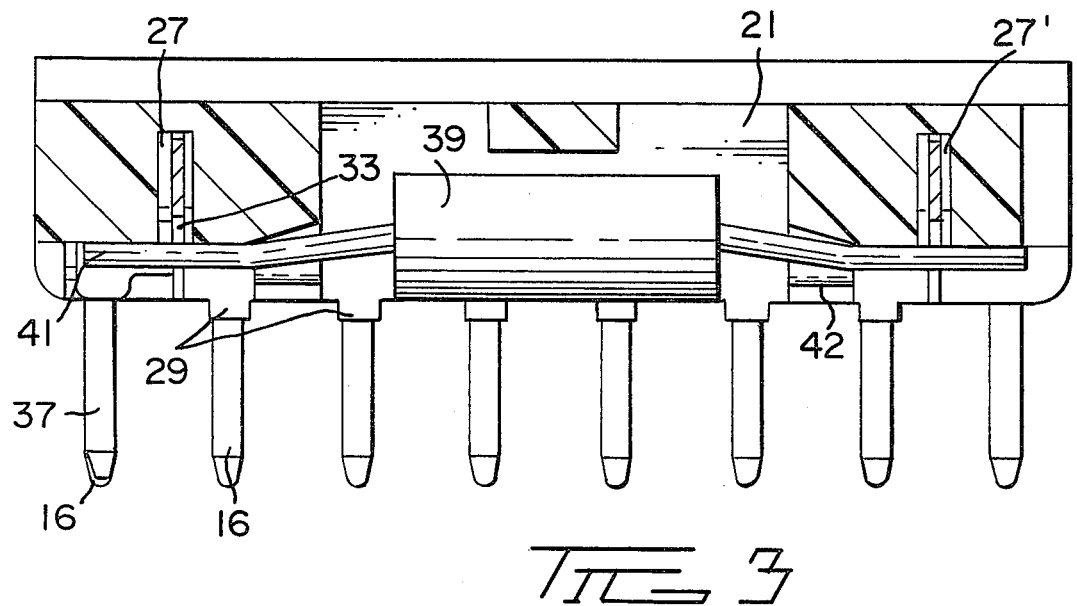
FIG. 3 is a cross-sectioned view of the assembly taken along line III—III of FIG. 2.
Figure 4:
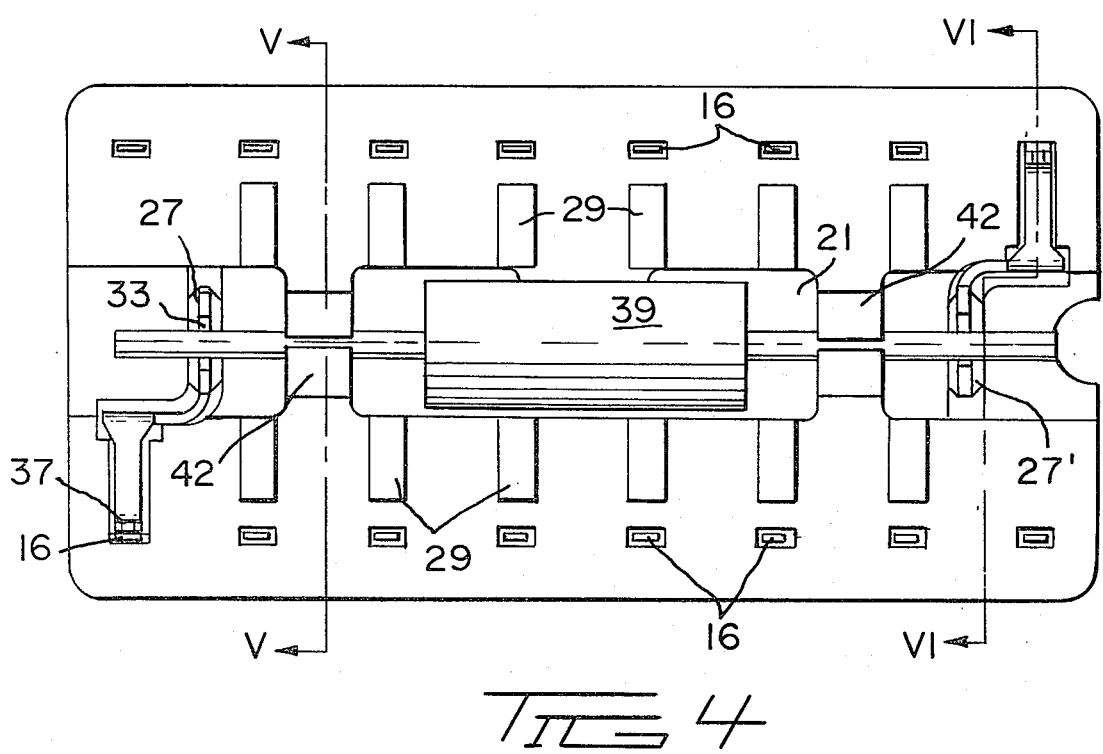
FIG. 4 is an underplan of the assembly.
Figure 5:
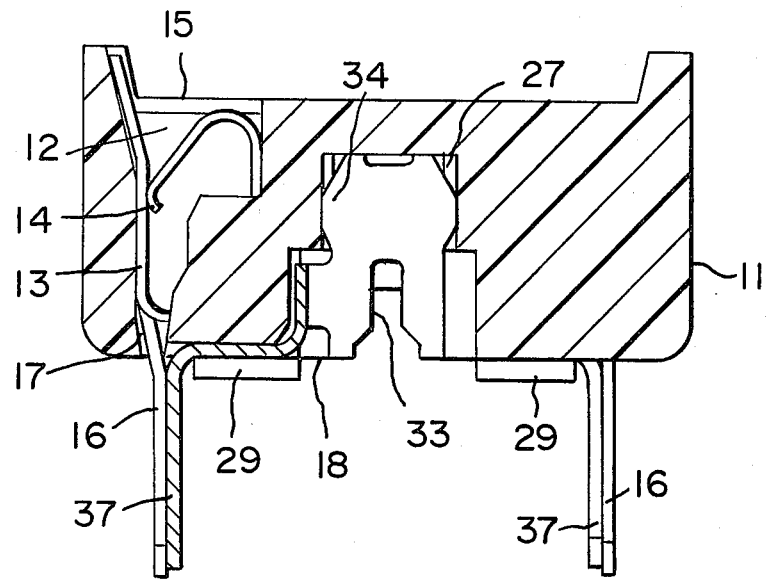
FIG. 5 is a cross-sectional view taken along the V—V of FIG. 4 with the capacitor omitted.
Figure 6:
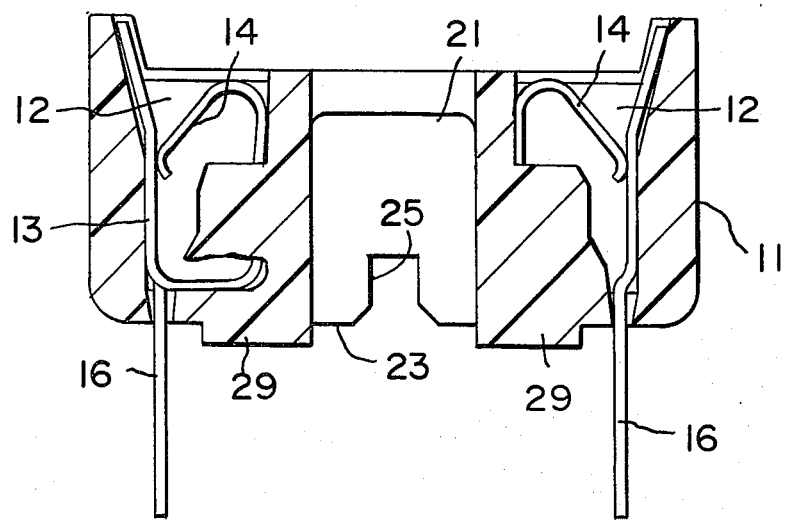
FIG. 6 is a cross-sectional view taken along the VI—VI of FIG. 4 with the capacitor omitted.

The dual-in-line socket assembly includes a housing 11 moulded in one piece from insulating material with rows of aligned contact receiving cavities 12 and electrical contacts 13 received in respective cavities. The contacts are of known construction, similar to those described in U.S. Pat. No. 4,060,296, and have receptacle portions 14 opening towards a first, plug-receiving, face 15 and tabs 16 extending through aperture 17 at bases of the cavities to project from a second housing face 18.

The housing 11 is formed with an elongate component-receiving recess 21 opening to the second face 18 and communicating at respective opposite ends with channels 22, 22'. Pairs of lands 23, 24 extend part way across the channel adjacent opposite ends of the recess 21 to define narrow lead receiving channel portions 25. Terminal receiving slots 27, 27' are formed in the housing 11 and opening to the second face at the bases of the channels 22, 22'. Terminal-receiving grooves 30 and 30' are formed in respective diagonally opposite portions of the second face to extend along respective opposite side walls of the recesses 22 and 22' to preselected apertures 17, and 17'. Rows of feet 29 are formed along opposite sides of the second face to provide conventional stand offs from a printed circuit board.

Terminals 31 are anchored in the second face of the housing adjacent each end of the rcess 21. Each terminal 31 is stamped and formed in one piece from sheet metal and includes a plate portion 32 having a lead-receiving slot 33 opening at one end of the plate portion and an anchoring portion 34 of increased width adjacent an opposite end of the plate portion. The plate portion 32 is integrally joined to a tab portion 37 by a body having a first portion 35 extending perpendicularly from an edge of the plate portion, being bent along a first fold line parallel with the slot 33 and a second portion 36 extending perpendicularly between the first portion 35 and a root end of the tab portion 37, being bent along fold lines perpendicular to the slot 33.

The terminals can be automatically assembled with the housing using simple insertion apparatus with the anchoring portions 34 wedged in the slots 27 and the body portions 35 and 36 received in the grooves 30, 30' so that the tab portions 37 extend parallel and adjacent diagonally opposite contact tabs 16. A capacitor 39 having leads 41 may then be inserted directly into the housing 11 with the capacitor body received in the cavity 21 and the leads gripped by walls of the slots 33. During or subsequent to insertion, portions of the lands 23, 24 are plastically deformed to extend over the leads to provide strain relief.

When the assembly is plugged into a printed circuit board, the tabs 16 and 37 are received in common apertures and are electrically connected together by solder flow during the wave soldering step ordinarily used to connect the tab 16 to the printed circuit board.

It should be noted that the capacitor is contained completely within the profile of the socket assembly requiring no additional board space and not interfering with connections either to the printed circuit board or to a dual-in-line package subsequently plugged into the socket assembly. Thus, no additional wiring or soldering steps are required, nor are additional modifications (such as extra apertures) required to the printed circuit board.

In a modified version of the dual-in-line socket assembly suitable for manual application to a printed circuit board, the tabs 16 are bent intermediate their ends as shown in dotted lines in FIG. 1 for effective engagement with the printed circuit board.

We claim:

1. A dual-in-line socket assembly comprising a housing moulded in one piece from insulating material with rows of aligned contact-receiving cavities and electrical contacts received in respective cavities, the contacts having receptacle portions opening to a first, plug receiving, face of the housing and tab portions projecting from a second, opposite, face of the housing, the improvement comprising first and second terminals each stamped and formed in one piece from sheet metal and comprising a component lead contacting portion and a tab portion, the terminals being anchored in the housing in spaced apart relation with the tab portions of the terminals extending closely adjacent tab portions of respective predetermined contacts to provide composite plugs whereby each terminal tab portion can be plugged into a common aperture in a printed circuit board.

2. A dual-in-line socket assembly according to claim 1 in which the lead connecting portions comprise plate portions provided with lead receiving data opening towards a common face of the housing.

3. A dual-in-line socket assembly according to claim 1 or claim 2 in which the housing is formed with a recess extending between the rows of cavities and sized to receive a component body located completely within the profile of the housing, the lead connecting portions of the terminals being located adjacent respective opposite ends of the recess.

4. A dual-in-line socket assembly according to claim 3 in which the housing is provided with pairs of adjacent lands between respective ends of the recess and the lead connecting portions of the terminals, the lands of each pair defining between them a lead receiving slot and being deformable over mouths of the lands' slots to retain component leads therein.

5. A dual-in-line socket assembly according to claim 3 in which the recess and the lead receiving slots open to the second face of the housing.

6. A dual-in-line socket assembly according to claim 2 in which each plate portion is provided at an end remote from the slot opening with an enlargement received in a housing slot in a force fit thereby to anchor each terminal in the housing.

7. A dual-in-line socket assembly according to claim 6 in which the first terminal plate portion is integrally joined to the tab portion by a body having a first portion extending from an edge of the plate perpendicularly to the plate portion, being bent along a first fold line parallel with the lead receiving slot and a second portion extending perpendicularly between the first portion and a root end of the terminal tab, being bent along a fold line perpendicular to the lead receiving slot.

* * * * *